(12) United States Patent
Reinink et al.

(10) Patent No.: US 12,416,870 B2
(45) Date of Patent: Sep. 16, 2025

(54) MEASURING METHOD AND MEASURING APPARATUS

(71) Applicant: ASML Netherlands B.V., Veldhoven (NL)

(72) Inventors: Johan Reinink, Uden (NL); Jeroen Cottaar, Eindhoven (NL); Sjoerd Nicolaas Lambertus Donders, Vught (NL); Sietse Thijmen Van Der Post, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/774,743

(22) PCT Filed: Oct. 20, 2020

(86) PCT No.: PCT/EP2020/079514
§ 371 (c)(1),
(2) Date: May 5, 2022

(87) PCT Pub. No.: WO2021/089319
PCT Pub. Date: May 14, 2021

(65) Prior Publication Data
US 2022/0397834 A1    Dec. 15, 2022

(30) Foreign Application Priority Data
Nov. 5, 2019 (EP) ..................................... 19207109
Feb. 18, 2020 (EP) ..................................... 20157939

(51) Int. Cl.
*G03F 7/00*     (2006.01)
*G03F 9/00*     (2006.01)

(52) U.S. Cl.
CPC ........ *G03F 9/7088* (2013.01); *G03F 7/70625* (2013.01); *G03F 7/70633* (2013.01); *G03F 7/706845* (2023.05); *G03F 7/706851* (2023.05)

(58) Field of Classification Search
CPC .. G03F 7/70483; G03F 7/70491; G03F 7/705; G03F 7/70508; G03F 7/70516;
(Continued)

(56) References Cited

U.S. PATENT DOCUMENTS 5,166,752 A    11/1992  Spanier et al.
6,952,253 B2   10/2005  Lof et al.
(Continued)

FOREIGN PATENT DOCUMENTS

EP    1 628 164 A2    2/2006
EP    2 698 598 A1    2/2014
(Continued)

OTHER PUBLICATIONS

International Search Report and Written Opinion of the International Searching Authority directed to related International Patent Application No. PCT/EP2020/079514, mailed Jan. 27, 2021; 11 pages.
(Continued)

*Primary Examiner* — Steven H Whitesell
(74) *Attorney, Agent, or Firm* — Sterne, Kessler, Goldstein &Fox P.L.L.C.

(57) ABSTRACT

Apparatus and method for measuring one or more parameters of a substrate using source radiation emitted from a radiation source and directed onto the substrate. The apparatus comprises at least one reflecting element and at least one detector. The at least one reflecting element is configured to receive a reflected radiation resulting from reflection of the source radiation from the substrate and further reflect
(Continued)

the reflected radiation into a further reflected radiation. The at least one detector is configured for measurement of the further reflected radiation for determination of at least an alignment of the source radiation and/or the substrate.

15 Claims, 8 Drawing Sheets

(58) Field of Classification Search
CPC .......... G03F 7/70608; G03F 7/70616; G03F 7/70625; G03F 7/70633; G03F 7/70641; G03F 7/7065; G03F 7/70658; G03F 7/70675; G03F 7/70683; G03F 7/706845; G03F 7/706851
See application file for complete search history.

(56) References Cited

U.S. PATENT DOCUMENTS

| | | | | |
|---|---|---|---|---|
| 7,095,498 | B2* | 8/2006 | Horie | G01N 21/211 356/364 |
| 7,136,172 | B1* | 11/2006 | Johs | G01J 4/02 356/399 |
| 7,489,399 | B1 | 2/2009 | Lee | |
| 7,701,577 | B2 | 4/2010 | Straaijer et al. | |
| 7,791,724 | B2 | 9/2010 | Den Boef et al. | |
| 8,115,926 | B2 | 2/2012 | Straaijer | |
| 8,553,227 | B2 | 10/2013 | Jordanoska | |
| 8,681,312 | B2 | 3/2014 | Straaijer | |
| 8,692,994 | B2 | 4/2014 | Straaijer | |
| 8,792,096 | B2 | 7/2014 | Straaijer | |
| 8,797,554 | B2 | 8/2014 | Straaijer | |
| 8,823,922 | B2 | 9/2014 | Den Boef | |
| 10,670,974 | B2 | 6/2020 | Brussaard et al. | |
| 2004/0233437 | A1* | 11/2004 | Horie | G01N 21/211 356/369 |
| 2005/0173647 | A1* | 8/2005 | Bakker | G03F 7/70916 250/372 |
| 2007/0224518 | A1 | 9/2007 | Yokhin et al. | |
| 2010/0328655 | A1 | 12/2010 | Den Boef | |
| 2011/0026032 | A1 | 2/2011 | Den Boef et al. | |
| 2011/0102753 | A1 | 5/2011 | Van De Kerkhof et al. | |
| 2011/0249244 | A1 | 10/2011 | Leewis et al. | |
| 2012/0044470 | A1 | 2/2012 | Smilde et al. | |
| 2013/0028273 | A1* | 1/2013 | Lee | G03F 7/70025 372/5 |
| 2013/0162996 | A1 | 6/2013 | Straaijer et al. | |
| 2013/0215404 | A1* | 8/2013 | Den Boef | G03F 9/7026 355/44 |
| 2013/0304424 | A1 | 11/2013 | Bakeman et al. | |
| 2014/0019097 | A1 | 1/2014 | Bakeman et al. | |
| 2016/0161863 | A1 | 6/2016 | Den Boef et al. | |
| 2016/0282282 | A1 | 9/2016 | Quintanilha et al. | |
| 2016/0370717 | A1 | 12/2016 | Den Boef et al. | |
| 2017/0184981 | A1* | 6/2017 | Quintanilha | G03F 7/7065 |
| 2017/0205342 | A1* | 7/2017 | Krishnan | G01J 3/427 |
| 2017/0357155 | A1* | 12/2017 | Quintanilha | G03F 7/2004 |
| 2019/0025536 | A1* | 1/2019 | Barnhart | G02B 27/62 |
| 2019/0049861 | A1* | 2/2019 | Van Voorst | G03F 7/70616 |
| 2019/0094130 | A1* | 3/2019 | Blasenheim | G01B 11/02 |
| 2019/0101840 | A1* | 4/2019 | Van Der Post | G03F 9/7065 |

FOREIGN PATENT DOCUMENTS

| | | | |
|---|---|---|---|
| EP | 3 467 588 A1 | 4/2019 | |
| TW | 2019-31008 A | 8/2019 | |
| WO | WO-2010149436 A1 * | 12/2010 | ............ B82Y 10/00 |
| WO | WO 2011/012624 A1 | 2/2011 | |

OTHER PUBLICATIONS

Lemaillet et al., "Intercomparison between optical and x-ray scatterometry measurements of FinFET structures," Proc. of SPIE, Metrology, Inspection, and Process Control for Microlithography XXVII, vol. 8681, Apr. 10, 2013; 8 pages.

* cited by examiner

MEASURING METHOD AND MEASURING APPARATUS

CROSS REFERENCE TO RELATED APPLICATIONS

This application claims priority of EP application 19207109.0 which was filed on 2019 Nov. 5 and EP application 20157939.8 which was filed on 2020 Feb. 18 and whom are incorporated herein in their entirety by reference.

FIELD

The present invention relates to methods and apparatuses for measuring one or more parameters on a substrate using radiation emitted from a source. In particular it relates to using radiation reflected from a substrate both for measuring one or more parameters, and determining an alignment.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Different types of metrology tools may be used to measure properties and parameters of a lithographically exposed structure on a substrate. The measurements may for example be used to check the quality and/or characteristics of a performed exposure. Different types of parameters may be measured using different types of measurements. The measurements may use radiation, such as electromagnetic radiation, to interrogate a substrate. Different types of wavelengths of electromagnetic radiation may be used detect and observe different features or characteristics. For example, the wavelength of electromagnetic radiation may determine the size of a feature that can be observed. Radiation with a smaller wavelength may be used to perform measurements with a smaller spatial resolution. The wavelength may also affect the penetration depth of radiation into a substrate, and how deep down into a substrate properties can be measured. In order to be able to measure features on a substrate, radiation may be aligned to the features on the substrate. The accuracy of radiation alignment can affect the quality of the resulting measurement.

SUMMARY

According to a first aspect of the current disclosure there is provided an apparatus for measuring one or more parameters of a substrate using source radiation emitted from a radiation source and directed onto the substrate. The apparatus comprises at least one reflecting element configured to receive a reflected radiation resulting from reflection of the source radiation from the substrate and further reflect the reflected radiation into a further reflected radiation, and at least one detector configured for measurement of the further reflected radiation for determination of at least an alignment of the source radiation and/or the substrate.

Optionally, the apparatus further comprises at least one spectrally resolved detector configured to receive a diffracted radiation resulting from diffraction of the reflected radiation from the at least one reflecting element and/or from diffraction of the further reflected radiation from the at least one detector and/or from diffraction of the further reflected radiation from a further reflecting element.

Optionally, the at least one detector is an alignment detector or a spectrally resolved detector. Optionally, the spectrally resolved detector configured for measurement of the one or more parameters of the substrate.

Optionally, the at least one detector is an alignment detector.

Optionally, the at least one reflecting element is at least one reflecting alignment detector.

Optionally, the at least one reflecting element comprises a grating.

Optionally, the spectrally resolved detector is configured to measure the further reflected radiation.

Optionally, the at least one detector is position sensitive.

Optionally, the at least one detector is configured to obtain a measurement for determining an alignment of the radiation to the substrate.

Optionally, the at least one reflecting element and the at least one detector receive radiation simultaneously.

Optionally, the at least one reflecting element and/or the at least one detector is configured to receive radiation at an oblique angle.

Optionally, the at least one reflecting element and/or the at least one detector is configured to receive radiation at grazing incidence.

Optionally, the oblique angle is set so that one of the at least one detector is configured to reflect 50% or less of received radiation.

Optionally, the substrate comprises a structure, wherein the reflected radiation results from reflection of source radiation from the structure on the substrate.

Optionally, the structure comprises a metrology target.

Optionally, the source radiation comprises one or more wavelengths in the range of 0.01 nm to 100 nm.

Optionally, the radiation comprises one or more wavelengths in the range of 1 nm to 100 nm.

Optionally, the at least one detector comprises a semiconductor sensor.

Optionally, the at least one detector is configured to determine alignment of the source radiation to the substrate with a precision of at least 1 micrometre accuracy.

Optionally, the alignment of the source radiation and/or the substrate comprises an alignment of the radiation to a height component of the substrate.

According to another aspect of the current disclosure there is provided a method for measuring one or more parameters of a substrate, using source radiation emitted from a radiation source and directed onto the substrate. The method comprises receiving, by at least one reflecting element configured to receive a reflected radiation resulting from reflection of the source radiation from the substrate; reflecting, by the at least one reflecting element configured to reflect the reflected radiation into a further reflected radiation; receiving, by at least one detector configured for measurement of the further reflected radiation; and obtaining one or more measurements for determining an alignment of the source radiation and/or the substrate.

According to another aspect of the current disclosure there is provided a lithographic apparatus comprising an apparatus for measuring one or more parameters of a substrate as described above.

According to another aspect of the current disclosure there is provided a metrology apparatus comprising an apparatus for measuring one or more parameters of a substrate as described above.

According to another aspect of the current disclosure there is provided an inspection apparatus comprising an apparatus for measuring one or more parameters of a substrate as described above.

According to another aspect of the current disclosure there is provided a lithographic cell comprising an apparatus for measuring one or more parameters of a substrate as described above.

BRIEF DESCRIPTION OF THE DRAWINGS

Embodiments will now be described, by way of example only, with reference to the accompanying schematic drawings, in which.

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
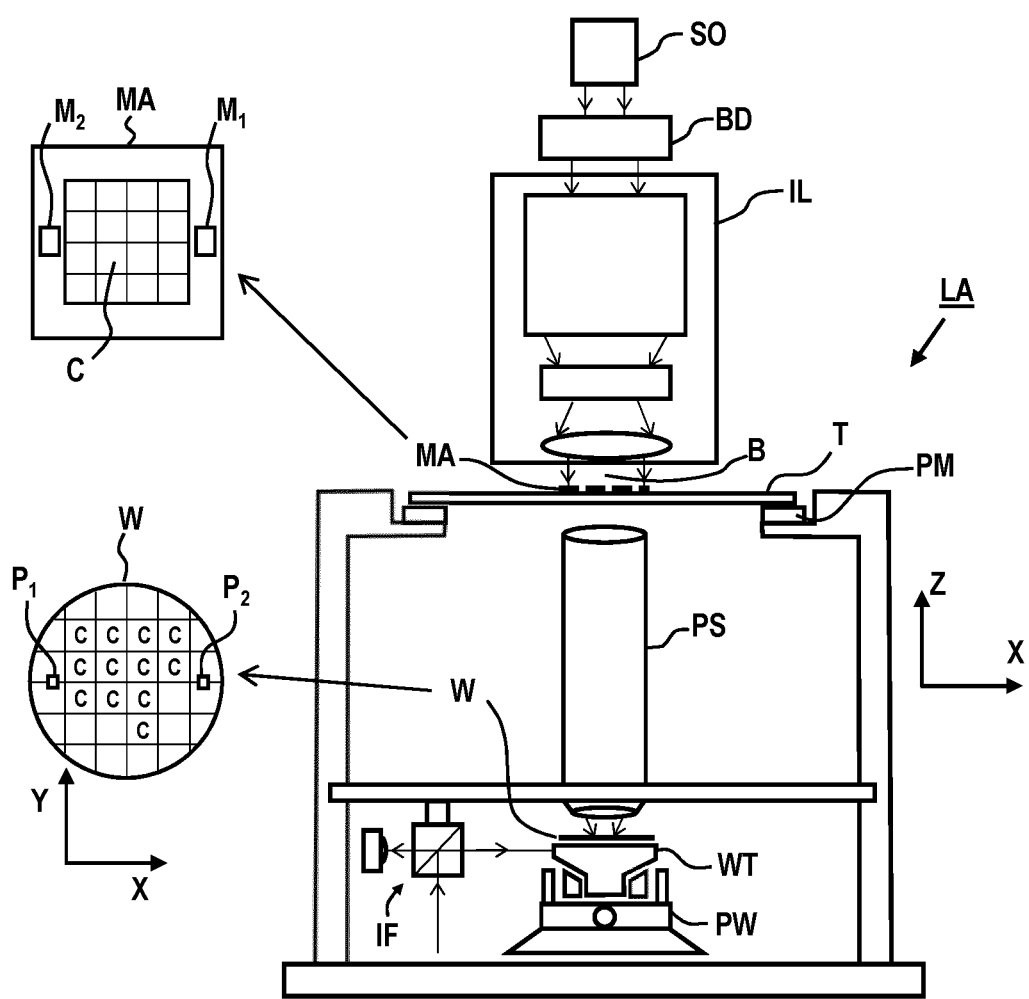
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
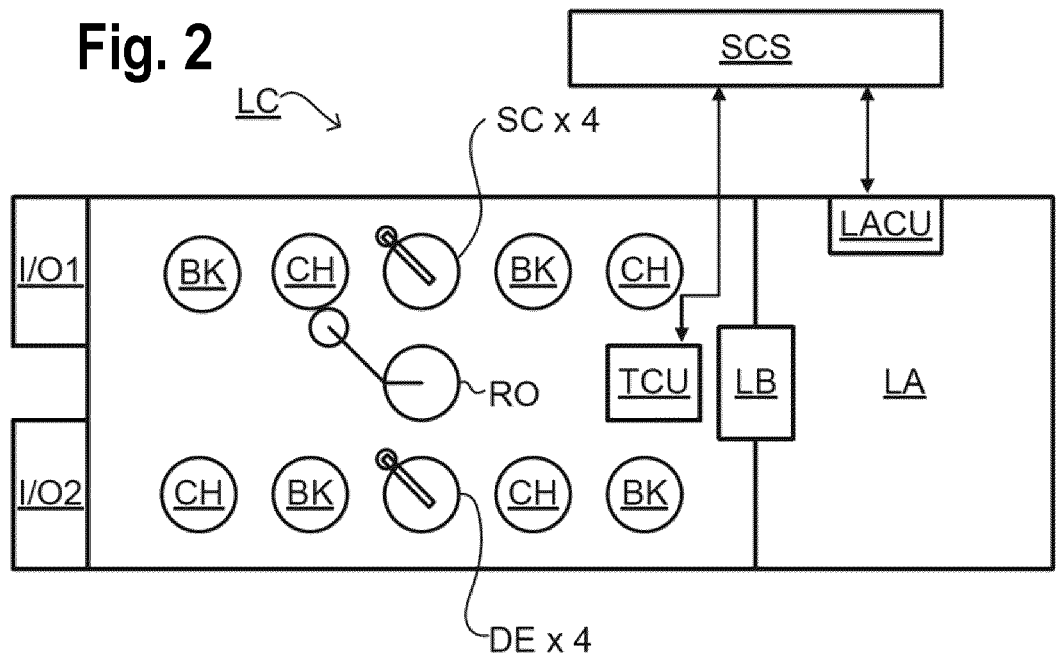
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray, extreme ultraviolet and visible to near-IR wavelength range.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 3:
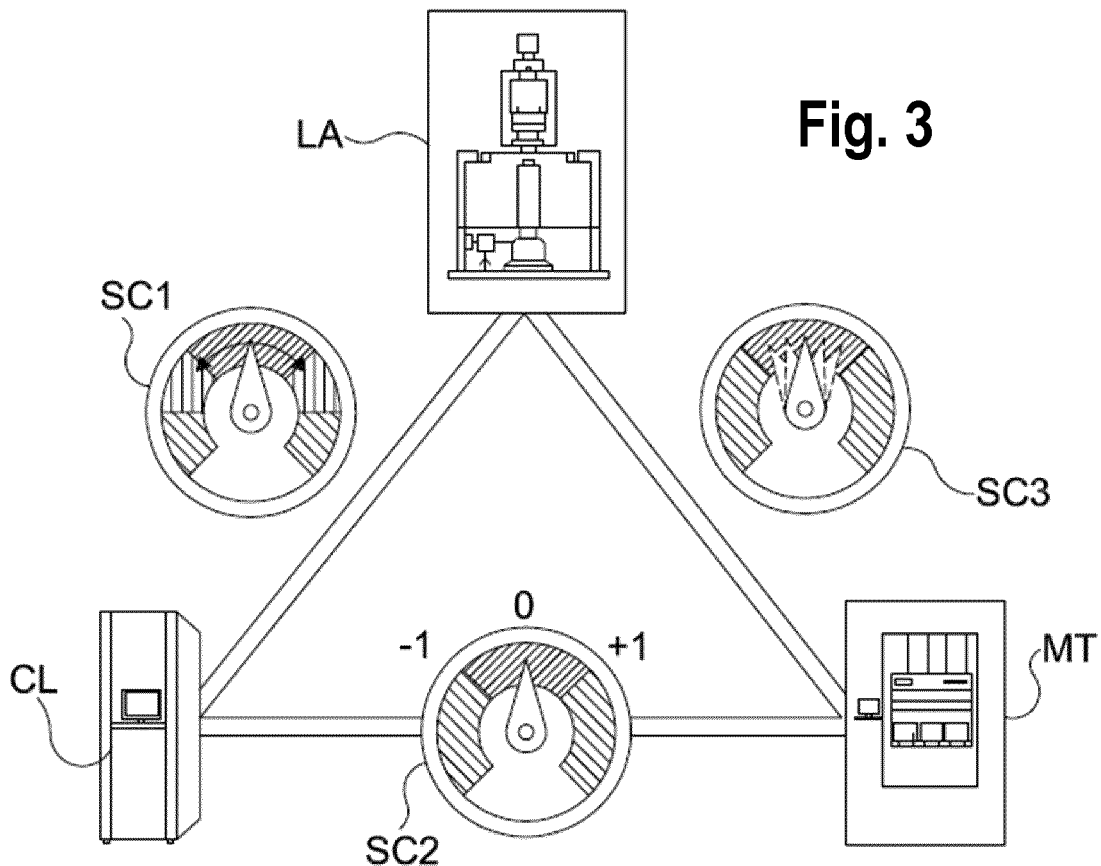
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray, extreme ultraviolet and visible to near-IR wave range.

Figure 4:
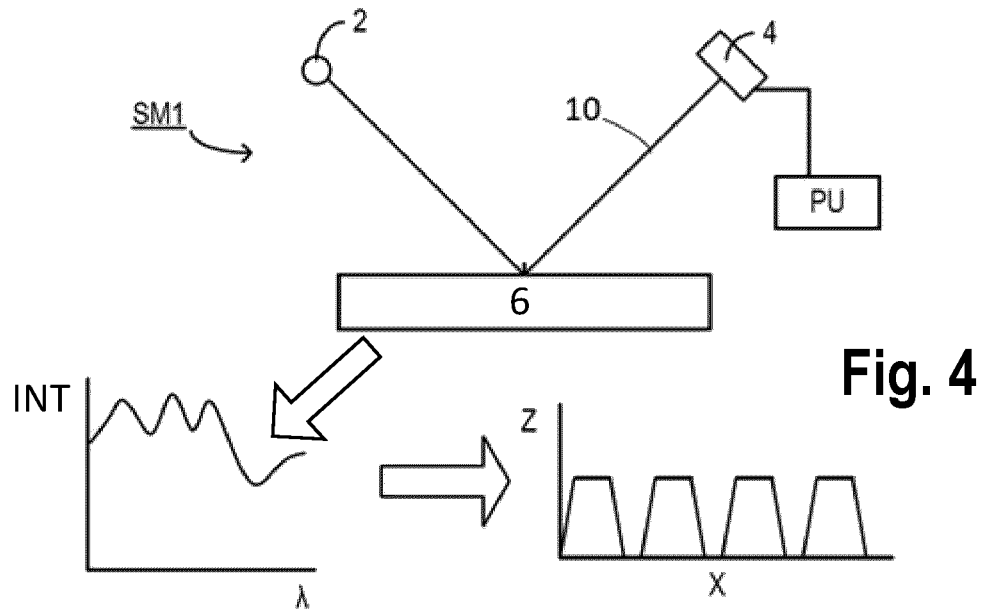
FIG. 4 schematically illustrates a scatterometry apparatus.

A metrology apparatus, such as a scatterometer, is depicted in FIG. 4. It comprises a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use soft X-rays or EUV radiation, for example radiation in a wavelength range between 0.1 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The content of the cited US patent application are incorporated herein by reference in their entirety.

Figure 5:
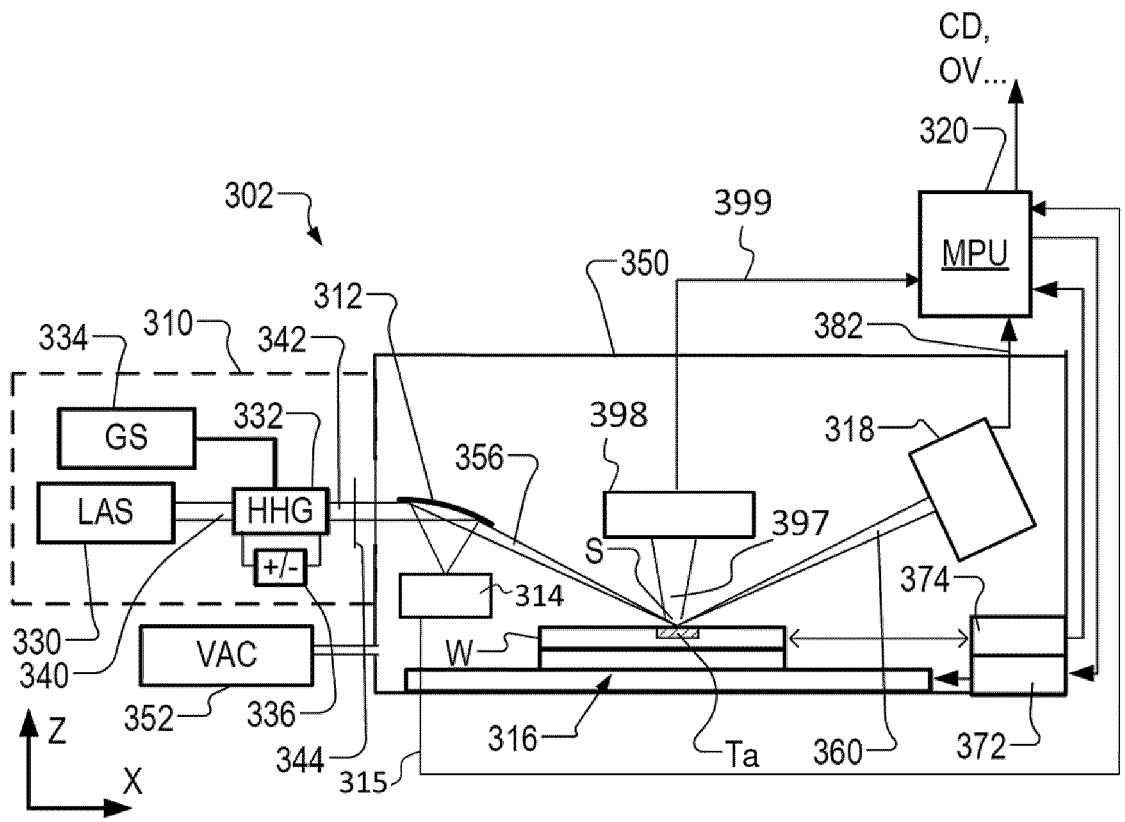
FIG. 5 depicts a schematic representation of a metrology apparatus in which EUV and/or SXR radiation is used.

FIG. 5 depicts a schematic representation of a metrology apparatus 302 in which radiation in the wavelength range from 0.1 nm to 100 nm may be used to measure parameters of structures on a substrate. The metrology apparatus 302 presented in FIG. 5 is suitable for the soft X-rays or EUV domain.

FIG. 5 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Main components of the radiation source are a drive laser 330 and an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). N2, O2, He, Ar, Kr, Xe gases can all be considered. These may be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. In an example embodiment, the focusing is performed to achieve a round or elliptical spot S under 10 m in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 5, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 5 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system.

Performance parameters to be measured can include overlay (OVL), critical dimension (CD), focus of the lithography apparatus while the lithography apparatus printed the target structure, coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation.

The properties of the radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) to obtain radiation at the desired wavelength(s). Using HHG to obtain EUV/SXR radiation is known. Radiation generated through the HHG process may be provided as radiation in metrology tools MT for inspection and/or measurement of substrates. The substrates may be lithographically patterned substrates. The radiation obtained through the HHG process may also be provided in a lithographic apparatus LA, and/or a lithographic cell LC. High harmonic generation uses non-linear effects to generate radiation at a harmonic frequency of provided drive radiation. The drive radiation may be pulsed radiation, which may provide high peak intensities for short bursts of time. High harmonic radiation may comprise one or more harmonics of the drive radiation wavelength(s), for example second, third, fourth . . . , nth harmonics of the drive radiation wavelength(s). The high harmonic radiation may comprise wavelengths in the extreme ultraviolet (EUV), soft X-Ray (SXR), and/or hard X-Ray part of the electromagnetic spectrum. The high harmonic radiation may for example comprise wavelengths in the range of 0.01 nm to 100 nm, 0.1 nm to 100 nm, 0.1 nm to 50 nm, 1 nm to 50 nm, or 10 nm to 20 nm.

Figure 6:
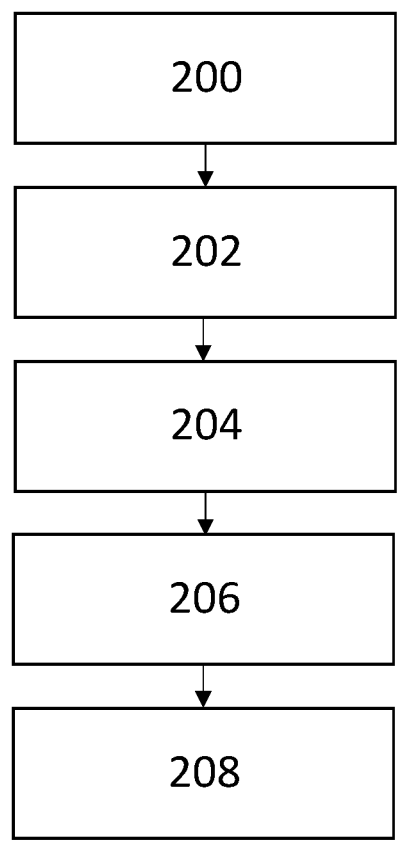
FIG. 6 depicts a flow diagram of steps in a method of generating high harmonic radiation.

FIG. 6 depicts a flow diagram of steps in an exemplary method of generating high harmonic radiation. In step 200 input radiation may be received in a cavity in which high harmonic generation (HHG) may take place. In step 202, drive radiation suitable for HHG may be formed from the input radiation inside the cavity. The drive radiation may be formed by increasing the intensity of the input radiation, for example through amplification and/or coherent addition. In step 204, the drive radiation may be shaped into a hollow beam. The shaping may be performed on the radiation before its intensity is sufficiently increased to form drive radiation. Shaping of radiation into a hollow beam may also be performed outside of the cavity. In step 206 drive radiation may be directed into an interaction region comprising a medium suitable for HHG. Once generated, at least some of the high harmonic radiation obtained through the HHG process may exit the cavity, as in step 208, through an output coupler and/or a further output coupler.

Radiation, such as high harmonic radiation described above, may be provided as source radiation in a metrology tool MT. The metrology tool MT may use the source radiation to perform measurements on a substrate exposed by a lithographic apparatus. The measurements may be for determining one or more parameters of a substrate, for example a structure lithographically exposed on the substrate. Using radiation at shorter wavelengths, for example at EUV and/or SXR wavelengths as comprised in the wavelength ranges described above, may allow for smaller features to be resolved by the metrology tool, compared to using longer wavelengths (e.g. visible radiation, infrared radiation). Radiation with shorter wavelengths, such as EUV and/or SXR radiation, may also penetrate deeper into a material such as a patterned substrate, meaning that metrology of deeper layers on the substrate is possible. These deeper layers may not be accessible by radiation with longer wavelengths.

In a metrology tool MT, source radiation may be emitted from a radiation source and directed onto a target structure (or other structure) on a substrate. The source radiation may comprise EUV and/or SXR radiation. The target structure may reflect and/or diffract the source radiation incident on the target structure. The metrology tool MT may comprise one or more sensors for detecting diffracted radiation. For example, a metrology tool MT may comprise detectors for detecting the positive (+1st) and negative (−1st) first diffraction orders. The metrology tool MT may also measure the specular reflected radiation (0th order diffracted radiation). Further sensors for metrology may be present in the metrology tool MT, for example to measure further diffraction orders (e.g. higher diffraction orders).

The wavelength(s) and other properties of a radiation beam may affect the quality and resolution of a measurement using that radiation. Next to the properties of the radiation itself, the quality of a measurement may also be affected by the alignment of the radiation to a structure to be measured on the substrate. Precise alignment control of radiation to the structure to be measured may improve the accuracy of obtained measurements. To align radiation to a target structure, metrology tools MT may employ a plurality of detectors to determine a precise location inside the metrology tool MT of a substrate on which the structure is present, as well as of the radiation beam. It is also possible for a metrology tool MT to align to a substrate or a portion of a substrate on which no structure is present, for example for calibration or test measurements. The detectors may comprise optical sensors, such as level sensors, and/or interferometers. Optical sensors may reflect at least part of a beam of optical radiation, and monitor the position of the beam reflected off the substrate. The sensors for determining alignment may operate separate from the sensors for performing measurement and/or inspection of the substrate by the metrology tool MT. The radiation used for alignment may be separate from radiation used to measure/inspect the substrate by the metrology tool MT. For example, sensors for alignment may measure radiation in the optical spectrum (e.g. visible radiation). The metrology tool MT may use EUV and/or SXR radiation for performing one or more measurements of a structure on a substrate, using a different set of sensors.

In order measure a parameter of a substrate and/or of a structure on a substrate using radiation, the radiation beam may be aligned to the substrate. In some cases, this may be achieved by aligning the substrate to a reference frame, which may be termed a metroframe, inside the metrology tool MT. The radiation beam may also be aligned relative to the same reference frame. This allows a position of the radiation beam relative to the target structure on the substrate to be determined, via the reference frame. Aligning the radiation beam and the substrate to the reference frame may require two separate sets of measurements. The use of a separate frame and separate measurements to determine two positions independently from each other, and then link them together via a shared reference frame may reduce the accuracy of the alignment. Furthermore, in order to align a radiation beam and a substrate to a reference frame across several degrees of freedom, several sensors may be needed. This increases the component count, and the amount of space required for measurements around the substrate.

To measure different degrees of freedom in which the substrate may be aligned, multiple sensors may be required. The degrees of freedom in which a substrate may move relative to a radiation beam may for example be expressed as translation in three axes X, Y, and Z, as well as rotation about the same axes: Rx, Ry, Rz. Some degrees of freedom, for example the height dimension for the substrate (Z) and rotation around axes perpendicular to the height dimension (Rx, Ry), may be more challenging to align. This may for example be due to the presence of a structure (e.g. a diffraction grating) on the substrate that interacts with radiation incident upon it. The degrees of freedom that can result in movement of the substrate in the height dimension (Z, Rx, Ry) may be referred to as degrees of freedom having a height component. The degrees of freedom that do not cause movement in the height dimension (X, Y, Rz) may be referred to as degrees of freedom having an in-plane component. Separate sensors may be needed to detect alignment along the different degrees of freedom, relative to the reference frame. This may increase the number of components needed to perform an alignment, and the amount of space required to host the components. Some or all of the sensors may require a direct beam, meaning that they need to be positioned in the path of the beam to be measured. This position may block a part of the reflected/diffracted radiation path for other sensors. This may mean that not all sensors can be used simultaneously, and sensors may have to be moved around to obtain the desired measurements. Some degrees of freedom may be difficult to measure, for example because of diffractive properties of the radiation and/or because of the presence of other sensors. The use of different types of radiation for measuring alignment and for performing a metrology function, and the use of a reference frame to indirectly align the radiation used for metrology to a substrate, may negatively affect the alignment of the radiation to the structure on the sample. The methods and apparatus described herein aim to address at least some of the challenges mentioned above.

Figure 7:
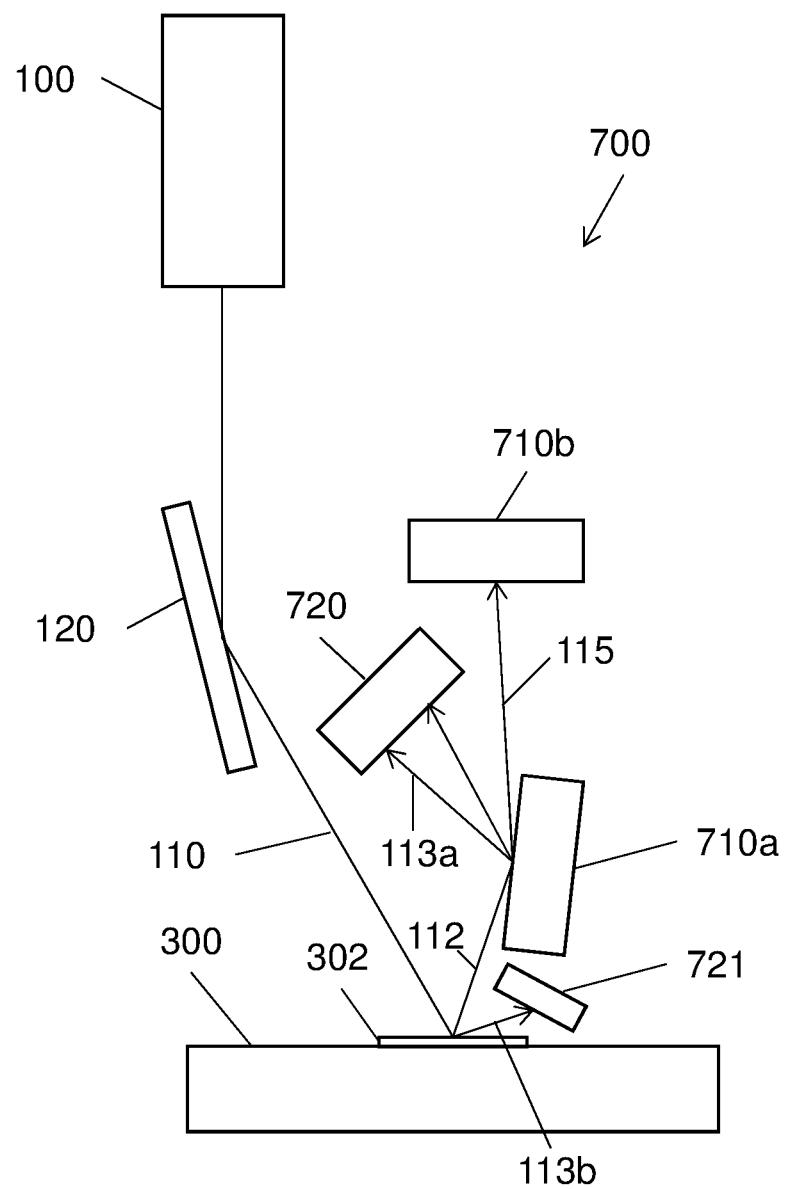
FIG. 7 depicts a schematic overview of an apparatus for measuring one or more parameters of a substrate.

FIG. 7 depicts and apparatus 700 for measuring one or more parameters of a substrate 300. The one or more parameters of the substrate may comprise one or more parameters of a structure 302 on the substrate, for example a lithographically exposed structure on substrate 300. The apparatus 700 may form at least part of a metrology tool MT. The one or more parameters may for example comprise overlay OVL, alignment AL, and/or levelling LVL data. The apparatus 700 uses a radiation source 100 configured to emit radiation 110. The radiation source 100 may form a part of the apparatus 700, or may be provided separate from the apparatus 700. The radiation 110 may be directed, for example using optics 120, onto the structure 302 on the substrate 300.

As shown in FIG. 7, the apparatus 700 further comprises at least one reflecting element 710a, which may be at least one reflecting detector, optionally at least one reflecting alignment detector, configured to receive reflected radiation 112. The reflecting detector, optionally the reflecting alignment detector, may be a detector with a reflective surface or interface which can reflect at least a portion of the reflected radiation 112. Optionally, the at least one reflecting element 710a comprises a grating. The reflected radiation 112 may be source radiation that has reflected from the substrate 300, for example reflected from structure 302 on substrate 300. The reflected radiation 112 may be zeroth order diffracted radiation, diffracted by structure 302 on substrate 300. In some implementations, the at least one reflecting element may for example comprise two reflecting elements. Optionally two reflecting detectors, optionally two reflecting alignment detectors, with the reflective surface or interface. The at least one reflecting element 710a may be configured to receive reflected radiation 112 from the substrate 300. At least one detector 710b, optionally at least one alignment detector or at least one spectrally resolved detector, may be configured to receive a further reflected radiation 115 from the at least one reflecting element 710a. In one embodiment, the at least one detector 710b is a spectrally resolved detector configured for measurement of the one or more parameters of the substrate. The least one detector 710b maybe position sensitive. Optionally, the at least one detector 710b is configured to obtain a measurement for determining an alignment of the radiation to the substrate. Optionally, when the at least one reflecting element 710a is a reflecting alignment detector, the at least one reflecting element 710a and the at least one alignment detector 710b are the same or similar types of detectors.

The apparatus 700 further comprises one or more other detectors, for example spectrally resolved detectors 720, 721 configured to receive diffracted radiation. Detector 721 may be a metrology detector, e.g. a CCD or a CMOS camera. As described herein, a detector may be spectrally resolved by measuring and/or distinguishing between different radiation frequencies. A detector may also be spectrally resolved by being spatially resolving and linking the position of radiation on the detector to a frequency, for example for radiation frequencies spatially separated through diffraction. The diffracted radiation may result from diffraction of the reflected radiation 112, for example by placing a diffracting structure in the path of the reflected radiation 112. Additionally or alternatively, radiation may be diffracted by the structure 302 into non-zero diffraction orders, and may be measured by one or more spectrally resolved detectors 721. In the example of FIG. 7, the at least one reflecting element 710a may comprise a diffracting structure that is arranged to diffract at least part of the received reflected radiation 112. The spectrally resolved detector 720 is configured to receive the diffracted radiation from the at least one reflecting element 710a. At least some of the radiation may be transmitted into the detector 710b for a measurement to be performed. Optionally, when the at least one reflecting element 710a is at least one reflecting detector, at least some of the radiation may be transmitted into the at least one reflecting alignment detector 710a for a measurement to be performed.

The spectrally resolved detector 720 and/or 721 may be configured for measurement of the one or more parameters of the structure. The at least one detector 710b is configured for determination of an alignment of the source radiation 110 and/or the substrate 300. The at least one detector 710b may be position sensitive so that it can detect where a radiation beam is incident upon the detector, for determining an alignment of the detector. In one embodiment, the at least one reflecting element 710a is a reflecting alignment detector, and it has the same or similar function as the at least one detector 710b. The position on the detectors on which radiation is incident may be used to determine angles and/or directions of incidence. This may in turn be used to determine a position and/or an alignment of the radiation beam to the substrate 300. A spectrally resolved detector 720, 721 may be spectrally resolved for measuring one or more parameters of the structure 302 or reflected radiation 112. The alignment of the radiation and/or the substrate 300 may be in relation to one or more degrees of freedom of the substrate 300. The alignment may be in relation to the degree of freedom having a height component (Z, Rx, Ry) of the substrate 300.

The apparatus may comprise further detectors, optionally further alignment detectors, for example to align to degrees of freedom in the plane of the substrate 300 (e.g. X, Y, Rz). The apparatus 700 may for example use one or more further spectrally resolved detectors and/or metrology detectors 721 to detect non-zeroth order diffracted radiation of a structure 302 to determine an in-plane component of alignment of the substrate 300. One or more spectrally resolved detectors and/or metrology detectors 721 may be present in any of the embodiments described herein.

An advantage of the apparatus 700 set out above, may be that the same radiation is used for both metrology and alignment. The source radiation reflected from the substrate 300, e.g. from structure 302, may be used to measure one or more parameters of the substrate 300 and/or structure 302 by the spectrally resolved detector 720. The same radiation may also be used to determine an alignment by measuring the radiation reflected from the substrate 300 using the at least one detector 710b, optionally together with the at least one reflecting detector 710a. Radiation reflected an/or diffracted from substrate 300 and/or structure 302 may simultaneously be used for a measurement by the at least one reflecting detector 710a and the at least one detector 710b, optionally also by the detectors 721 and/or 720. Another advantage of the apparatus 700 may be that an alignment of source radiation 110 may be determined directly in relation to the substrate 300. The alignment procedure may be performed without using a reference frame. Another advantage of the apparatus 700 described herein may be that the alignment measurements may be robust against spectral shift or other spectral instability present in the radiation.

The reflected radiation 112 received by the at least one alignment detector 710b and/or by the at least one reflecting detector 710a, may comprise specular reflected radiation. Specular reflected radiation may also be referred to as zeroth order diffracted radiation. An advantage of determining alignment using specular reflected radiation 112 may be that the direction of the reflected radiation 112 is not dependent on diffractive properties of the substrate, e,g, of the structure 302. As a result, the direction of the reflected radiation 112 may be more closely linked to the alignment of the incident source radiation 110 to the substrate 300. This may lead to improved alignment results compared to alignment measurements using higher order diffracted radiation. A spectrally resolved detector 720 may be placed in the path of the specular reflected radiation 112 to perform measurement of one or more parameters of the structure. However, it is also possible to measure one or more parameters without metrology of the specular reflected radiation, for example by using the non-zeroth order diffracted radiation from a structure 302, measured by further spectrally resolved detector 721.

Figure 8:
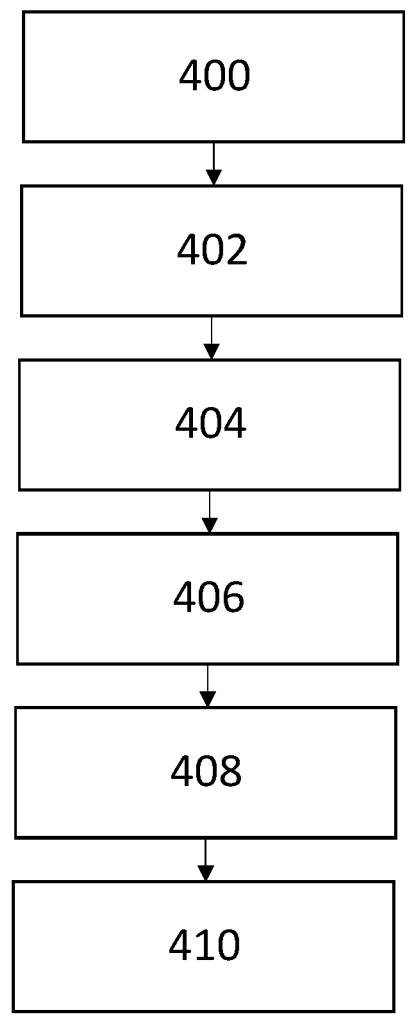
FIG. 8 depicts a flow diagram of steps in a method of measuring one or more parameters of a substrate.

FIG. 8 depicts a flow diagram of steps in a method for measuring one or more parameters of a substrate 300. In step 400 source radiation 110 is directed by a source 100, optionally via the optics 120, at the substrate 300, for example at the structure 3002 on substrate 300. In step 402, the source radiation 110 interacts with the substrate 300 and/or structure 302. As part of the interaction, at least some of the source radiation is reflected, forming reflected radiation 112. In step 404 the at least one reflecting element 710a receives reflected radiation 112 resulting from a reflection of source radiation 110 from the structure 302 and reflect the reflected radiation 112 into a further reflected radiation 115. Optionally in step 404 the at least one detector 710b receives the further reflected radiation 115 simultaneously. In step 406 one or more measurements for determining an alignment of the source radiation 110 and/or the structure 302 may be obtained based on the received radiations. Optionally, at least some of the reflected radiation 112 or the further reflected radiation 115 may be diffracted by a diffracting structure e.g. a grating, optionally of the at least one reflecting element 710a, to produce diffracted radiation 113a. Diffraction may for example be performed by a diffraction grating placed in the path of the reflected radiation. Alternatively or additionally, radiation may be diffracted 113b by structure 302 and at least one non-zero diffracted order may be received and measured by the further spectrally resolved detector 721. In step 408 at least some of the diffracted radiation 113a may be received by the spectrally resolved detector 720. In step 410 the spectrally resolved detector 720 may measure the one or more parameters of the structure 302 based on received diffracted radiation 113a. Alternatively or additionally, step 410 may relate to further spectrally resolved detector 721 measuring the one or more parameters if structure 302 based on received diffracted radiation 113b.

When the source radiation 110 reaches the structure 302 on the substrate 300, at least some of the source radiation 110 may be reflected as described above. However, other interactions of the source radiation 110 with the structure 302 may occur. The structure 302 may be a diffracting structure, in which case some of the radiation may be diffracted into for example +1st and −1st diffraction orders, and higher diffraction orders. One or more further metrology sensors 721 may be provided to measure one or more non-zero orders diffracted by the structure 302. Some of the source radiation 110 incident on the substrate 300 may also be absorbed by the substrate 300.

An alignment detector or reflecting alignment detector may be a position sensitive detector (PSD), that is to say, sensitive to (and able to measure a position of) where the detected radiation is incident on the surface of the detector. The spectrally resolved detector 720 may also be position sensitive. As discussed with respect to FIG. 12 below, the spectrally resolved detector 720 may form part of the at least one alignment detector. For example a spectrally resolved detector 720 may be positioned in the path of radiation reflected by the structure 302 on substrate 300. The position at which radiation in incident on a PSD may be used for determining alignment of the source radiation 110 relative to the substrate 300. In particular, adjusting a height component of the alignment of the substrate 300 may affect the position at which reflected radiation 112 hits an alignment detector. The position at which reflected radiation 112 is incident on a detector 710a, 710b, 720 may therefore be used to align the source radiation to a height component of the substrate 300.

A spectrally resolved detector 720, 721 may be spectrally resolved, that is to say, it is able to distinguish between different wavelengths of radiation incident upon it. Spectrally resolved measurements may be used for measuring the one or more parameters of the structure 302. Optionally, spectrally resolved measurements may be used to contribute to a determination of an alignment of the source radiation 110 to the structure 302.

A further spectrally resolved detector 721 may be placed in the path of radiation diffracted by structure 302 on substrate 300. The diffracted radiation 113b may be non-zeroth order diffracted radiation. Alternatively or additionally, the specular reflected 112 radiation may be diffracted to form diffracted radiation 113a, for example by placing a diffraction grating in the path of the reflected radiation beam 112. A diffraction grating may for example be provided separately, or on an alignment detector or other optical element in the radiation path. A spectrally resolved detector 720 may then be used to capture at least some of the diffraction orders. The radiation captured by the spectrally resolved detector 720 may comprise at least one non-zero diffraction order. In some implementations, the captured diffraction orders may comprise the zeroth diffraction order. The spectrally resolved detector 720 and/or further spectrally resolved detector 721 may measure one or more parameters of the structure 302 on the substrate 300. The parameters may include overlay, levelling, alignment, critical dimension, focus, and/or other parameters of the patterned substrate (which may be referred to as stack parameters).

The source 100 may emit source radiation 110 comprising one or more wavelengths in the EUV and/or SXR range, as defined above. The source radiation 110 may for example comprise one or more wavelengths in the range of 0.01 nm to 100 nm, 1 nm to 100 nm, or 0.01 nm to 10 nm. A lot of materials may be partially or fully transparent for wavelengths in SXR and/or EUV wavelength ranges. This may make providing an alignment setup in these wavelength ranges challenging due to limitations in materials and optical elements available to control the SXR and/or EUV radiation. This may be addressed by controlling the interaction of radiation with a material by adjusting the angle of incidence of radiation on the substrate. For example, the radiation may be provided at an oblique angle of incidence, that is to say, non-perpendicular radiation angle of incidence to the surface of the optical element. In this context, the angle of incidence of radiation perpendicular to a surface may be considered to be a 0° angle, and the angle of incidence of radiation parallel to a surface may be considered to be a 90° angle. As the angle of incidence increases, the amount of interaction of the radiation with the material may increase, and the amount of radiation transmitted through the material without interacting may be reduced. Adjusting the angle may be used to set the amount of radiation that is reflected from a surface, and the amount of radiation that is transmitted into the material(s) forming the surface.

A radiation beam may approach an optical element, for example a detector or a reflecting element, at a grazing angle of incidence, that is to say, incidence so that the radiation beam approaches being parallel to the surface. Grazing incidence may for example be at an angle in a range from 80°-90° incidence, 75°-90° incidence, or 70°-90° incidence. The angle of incidence may be adjusted to obtain a certain amount of reflectivity of incident radiation on the surface of the detector. One or more coatings, for example a mirror coating, may be applied to the detector to adjust the angle of incidence required to obtain a certain amount of reflectivity. Such coatings may results in smaller angles of incidence having a desired reflectivity, For example, using one or more mirror coatings, an angle of incidence in a range of 45°-90° incidence may be of interest. The amount of radiation reflected by the substrate may be set so that the remainder of the optical path retains sufficient radiation intensity so that the radiation can be measured, for example for further metrology and/or alignment measurements. The portion of radiation incident on a surface to be reflected may be varied for example in a range from 10% and 90%, or in a range from 1% and 99%, by varying the angle of incidence of the radiation beam. The angle of incidence may be designed so that 50% or less of the incident radiation is reflected. In one example, the angle of incidence of a radiation beam on a surface of a detector may be set so that approximately 50% of the incident radiation is reflected, and 50% of the incident radiation is transmitted into the surface material. In implementations where the radiation beam comprises multiple wavelengths, the proportion of reflection and transmission may vary for different wavelengths. The angle of incidence may for example be chosen to achieve a desired proportion of reflection and transmission for one or more selected wavelengths.

In one embodiment, apparatus 700 as described herein may comprise multiple detectors 710a, 710b in order to determine an alignment over multiple degrees of freedom. Reflecting alignment detector 710a, alignment detector 710b and/or other detectors which may be used to capture specular reflection may be placed in series along an optical path of a reflected radiation beam 112. In some instances further detectors may be positioned for capturing radiation that propagates along paths other than the specular reflection propagation path. For example, one or more detectors, such as a further spectrally resolved detector 721, may be positioned in the apparatus to capture non-zeroth order diffracted radiation. A plurality of detectors may receive radiation simultaneously. In some implementations, an apparatus 700 may comprise the reflecting alignment detector 710a and alignment detectors 710b in series along an optical path of a specular reflected radiation beam. The alignment detectors may be referred to as a first alignment detector and a second alignment detector. The first and second alignment detectors may be placed in series so that both are able to measure alignment of the radiation based on specular reflected radiation from a substrate 300 simultaneously. The same may apply to a greater number of detectors placed in series.

As described above, when 710a and 710b are placed in series, the at least one reflecting elements 710a may be positioned so that it receives specular reflected radiation 112 from the substrate 300. This may also be referred to as first reflected radiation. The at least one reflecting element 710a may be oriented to set an angle of incidence of the first reflected radiation received. Setting the angle may be done to determine a proportion of reflected and transmitted radiation, as described above. The at least one reflecting element 710a may reflect a portion of the radiation incident upon it, referred to as the further reflected radiation. The at least one detector 710b may be positioned in the path of the further reflected radiation. The at least one detector 710b may be oriented to set an angle of incidence for the second reflected radiation received. This may be to set a proportion of radiation reflected and transmitted radiation. Radiation reflected from the at least one detector 710b detector may propagate towards one or more further detectors and/or other optical elements, for example a spectrally resolved detector or a diffracting structure. In some implementations, the at least one reflecting element 710a and/or the at least one detector 710b may comprise a grating structure, such as a diffraction grating, on its surface, so that some of the incident radiation may be diffracted. In other implementations, a diffraction grating may be present on the at least one reflecting element 710a, in which case the at least one detector 710b may be placed in the path of the zeroth order diffracted radiation. Diffracted radiation 113a, and in particular non-zeroth order diffracted radiation, may be used for metrology of radiation originally specular reflected by the substrate 300. In some implementations, a spectrally resolved detector 720 may also measure specular reflected radiation.

Figure 9:
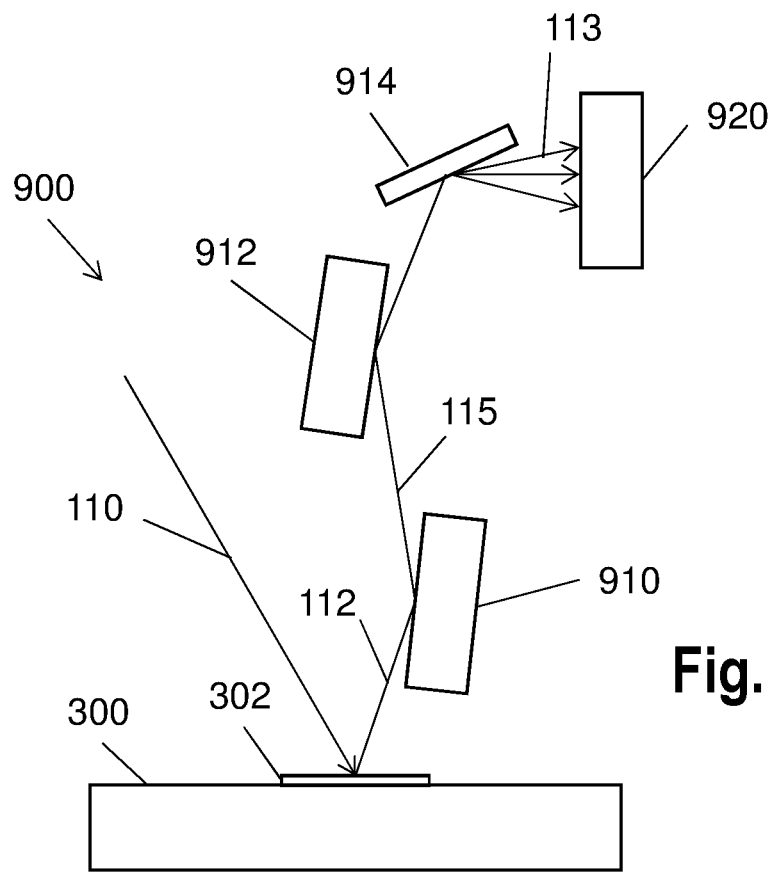
FIG. 9 depicts a schematic representation of an apparatus for measuring one or more parameters of a substrate comprising a diffraction grating.

FIG. 9 depicts an exemplary implementation of an apparatus 900 for measuring one or more parameters of a structure 302 on a substrate 300. Source radiation 110 incident on structure 302 may be reflected to form reflected radiation 112, which is directed to at least one reflecting element 910, optionally a at least one reflecting alignment detector 910. The reflecting alignment detector 910 may be position sensitive, that is to say, it is sensitive to where on the detector reflected radiation 112 is incident. The position sensitive information may be used to obtain at least a part of an alignment measurement. The reflecting alignment detector 910 may use a portion of the reflected radiation 112 incident upon it to perform the alignment measurement. Another portion of the reflected radiation 112 incident on reflecting alignment detector 910 may be reflected to produce further reflected radiation 115, which is reflected towards a at least one detector 912, optionally an alignment detector 912. A portion of the radiation 115 incident on alignment detector 912 may be used to obtain a second alignment measurement. A further portion of the further reflected radiation 115 incident on the alignment detector 912 may be reflected to further reflecting element, optionally a diffraction grating 914, for example a periodic diffraction grating.

The diffraction grating 914 may diffract at least a portion of the radiation incident upon it to produce diffracted radiation 113. At least some of the diffracted radiation 113 may be incident on a spectrally resolved detector 920. The spectrally resolved detector 920 may comprise one or more sensors for measuring one or more parameters of the structure 302. The one or more sensors in the spectrally resolved detector 920 may be configured to obtain a spectrally resolved measurement. Although the description refers to a diffraction grating 914, other diffracting structures may be provided as part of the apparatus. An advantage of this implementation may be that separate components perform separate tasks, therefore making adjustment of the setup, or replacement of one of the elements in the apparatus more straightforward.

Figure 10:
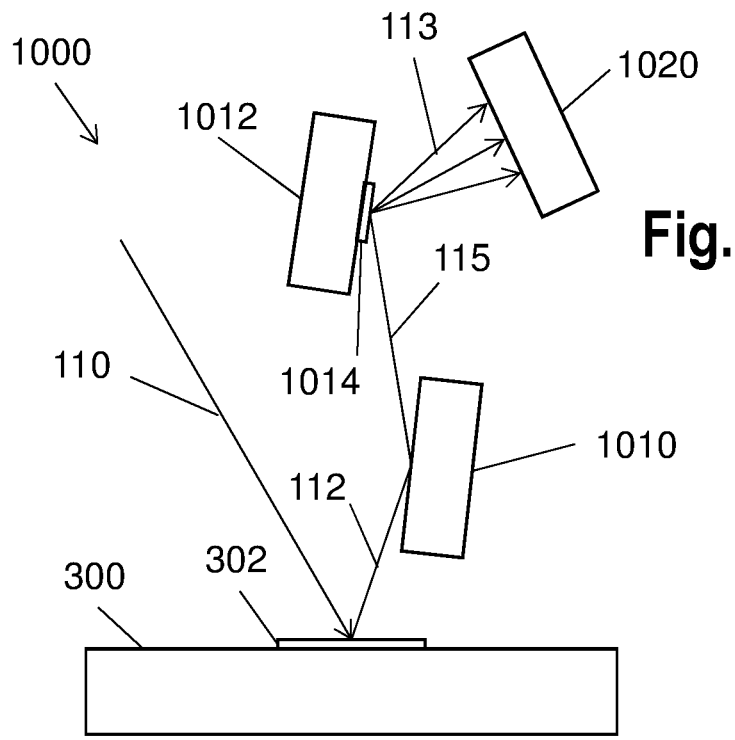
FIG. 10 depicts a schematic representation of an apparatus for measuring one or more parameters of a substrate comprising a diffraction grating on an alignment detector.

FIG. 10 depicts an exemplary implementation of an apparatus 1000 for measuring one or more parameters of substrate 300, for example one or more parameters of structure 302 on substrate 300. As with FIG. 9 above, source radiation 110 incident on substrate 300 may be reflected to form reflected radiation 112. The reflected radiation 112 may be incident on at least one reflecting element 1010, optionally a at least one reflecting alignment detector 1010 for performing an alignment measurement. Some of the radiation may be reflected off the reflecting alignment detector 1010 to form further reflected radiation 115. In one embodiment, the further reflected radiation 115 propagates to at least one detector 1012, optionally an alignment detector 1012. A portion of the radiation 115 incident on the alignment detector 1012 may be transmitted into the alignment detector to perform an alignment measurement. A diffraction grating 1014 may be present on the alignment detector 1012, and this may diffract part of the radiation incident on the detector, optionally a spectrally resolved detector 1012. The resulting diffracted radiation 113 may propagate towards a spectrally resolved detector 1020 for performing measurements of or relating to one or more parameters of substrate 300 and/or structure 302. An advantage of this setup may be that less space is required to perform measurement on the specular reflected radiation from the substrate 300, as the grating 1014 is included on the alignment detector 1012.

Figure 11:
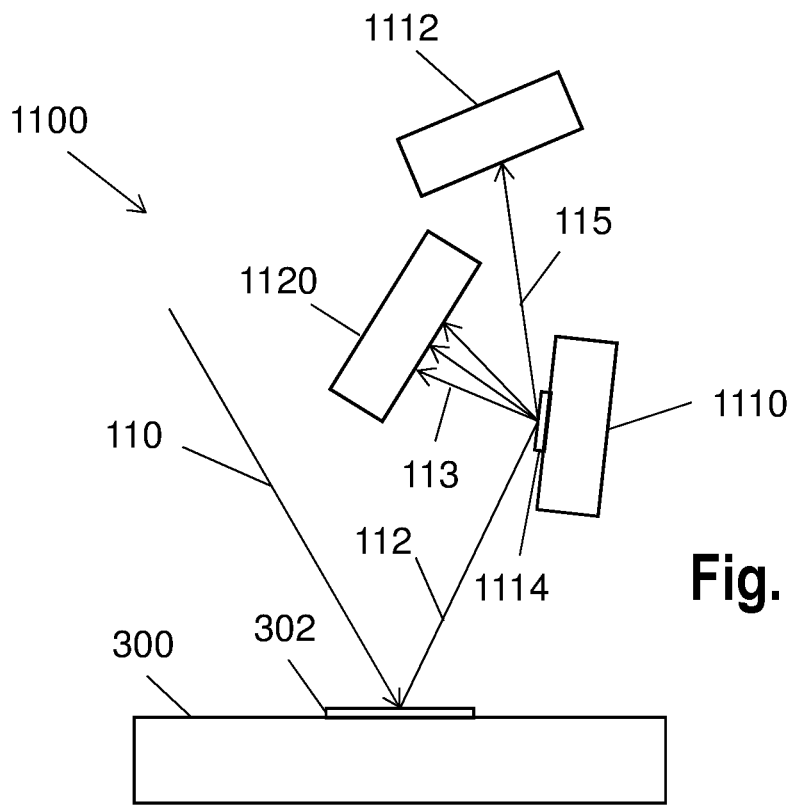
FIG. 11 depicts a schematic representation of an apparatus for measuring one or more parameters of a substrate comprising a diffraction grating on an alignment detector.

FIG. 11 depicts an exemplary implementation of an apparatus 1100 for measuring one or more parameters of substrate 300, for example one or more parameters of a structure 302 on substrate 300. As with FIGS. 9 and 10 above, source radiation 110 may be reflected off substrate 300 to form reflected radiation 112. Specular reflected radiation 112 may propagate towards and be incident upon a at least one reflecting element, optionally a reflecting alignment detector 1110. A portion of the radiation incident on the reflecting alignment detector 1110 may be used to perform an alignment measurement. The reflecting alignment detector 1110 may comprise a diffraction grating 1114. The diffraction grating may diffract a portion of the radiation incident on the reflecting alignment detector 1110 to form diffracted radiation. A portion of the diffracted radiation may be directed into a zeroth diffraction order 115, corresponding to a specular reflection of the radiation. The zeroth order diffracted radiation 115 may propagate towards a at least one detector, optionally an alignment detector 1112. The alignment detector 1112 may use at least a portion of the radiation incident upon it to perform an alignment measurement. The diffraction grating 1114 may diffract some of the radiation incident upon it into non-zero diffraction orders 113 (e.g. +1, −1, +2, −2, etc.) At least some of the non-zeroth order diffracted radiation 113 may propagate towards a spectrally resolved detector 1120. The spectrally resolved detector 1120 may measure one or more parameters of the substrate 300 and/or structure 302. An advantage of this setup over for example setups as in FIGS. 9 and 10, is that the zeroth order diffracted radiation 115 is used by the setup, which may increase the efficiency of the apparatus. Another advantage of the apparatus 1100 may be that it requires less components compared to setups where a grating is provided separately, which may allow for a more cost-effective setup, and may simplify the alignment process.

In another embodiment, the at least one reflecting element 1110 with the diffraction grating 1114 in FIG. 11 is replaced by a grating. In this case, the spectrum itself is used for alignment. This requires identifiable features in the spectrum that are considered stable in wavelength as a wavelength shift of the spectrum cannot be distinguished from an alignment change. The locations of the diffraction orders on the spectrally resolved detector 1120 are one input. The zero order falls onto a at least one detector, optionally an alignment detector 1112 that is placed with a path length difference.

Figure 12:
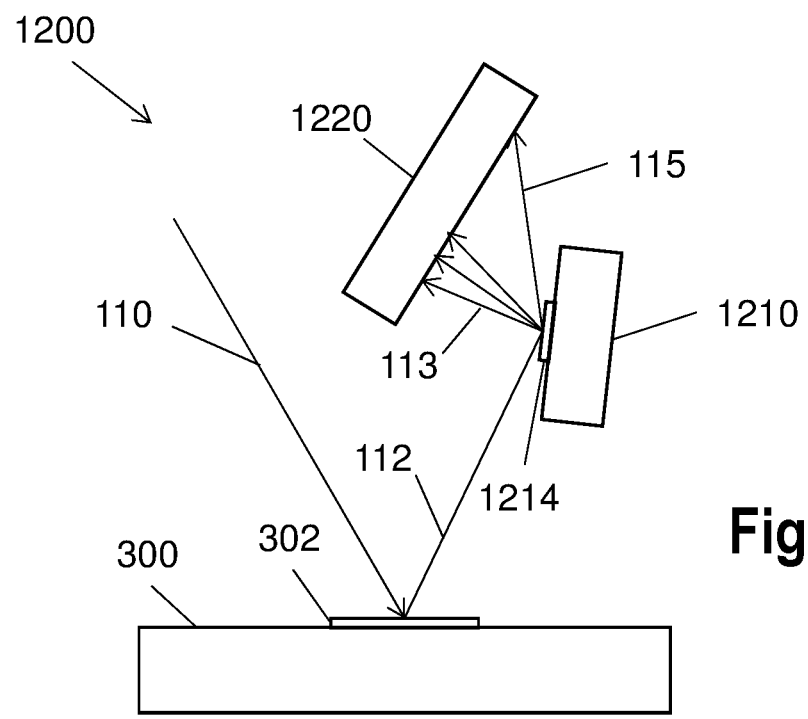
FIG. 12 depicts a schematic representation of an apparatus for measuring one or more parameters of a substrate wherein an alignment detector forms part of a spectrally resolved detector.

FIG. 12 depicts an exemplary implementation of an apparatus 1200 for measuring one or more parameters of a substrate 300, for example one or more parameters of a structure 302 on substrate 300. As with FIGS. 9-11 described above, source radiation 110 may be reflected by substrate 300 to form reflected radiation 112. As described in relation to FIG. 11, reflected radiation 112 may be incident upon a at least one reflecting element, optionally a reflecting alignment detector 1210 comprising a diffraction grating 1214. Some of the radiation 112 incident on the reflecting alignment detector 1210 may be used to perform an alignment measurement. Some of the radiation incident on the reflecting alignment detector may be diffracted by diffraction grating 1214. Both the zeroth order diffracted radiation 115 and one or more non-zeroth order diffracted radiation 113 may propagate towards and be incident on a at least one detector, optionally a spectrally resolved detector 1220. The spectrally resolved detector 1220 may have a large area suitable for sensing incident radiation, so that it can capture multiple diffraction orders. In this setup, the function of performed by the alignment detector 912, 1012, 1112 in FIGS. 9-11 is performed by the spectrally resolved detector 1220. The alignment detector may be seen as forming a part of the spectrally resolved detector 1220. The spectrally resolved detector 1220 may be position sensitive, and may perform an alignment measurement based on the zeroth order diffracted radiation incident on the spectrally resolved detector 1220. The spectrally resolved detector 1220 may further measure one or more parameters of substrate 300 and/or structure 302 based on the incident non-zeroth order diffracted radiation. As with FIG. 11, the setup of FIG. 12 uses the zeroth order diffracted radiation, and may therefore have a higher efficiency compared to setups were the zeroth order diffracted radiation is not used (e.g. FIGS. 9 and 10).

In another embodiment, the at least one reflecting element 1210 with the diffraction grating 1214 in FIG. 12 is replaced by a grating. In this case, the spectrum itself is used for alignment. This requires identifiable features in the spectrum that are considered stable in wavelength as a wavelength shift of the spectrum cannot be distinguished from an alignment change. The locations of the diffraction orders on the spectrally resolved detector 1220 are one input. The zero order or called further reflected radiation 115 is also captured by the spectrally resolved detector 1220. The downside of this geometry is the limited path length difference and a large detector 1220 that is needed, the upside is a simple setup using standard components.

The structure 302 may be a metrology target or part of a metrology target. A metrology target may comprise one or more features with known diffractive properties. The structure 302 may comprise one or more gratings. Gratings may be present on the surface of the substrate 300 or in lower layers within a stack of layers of the substrate 300. Features of a metrology target may for example comprise periodic diffraction gratings. A structure 302 for which one or more parameters are measured may be a structure belonging to a product feature patterned onto the substrate.

A position sensitive detector may comprise a semiconductor sensor having a multiple port output to determine a position of radiation on the sensor (e.g. a 2 port output for 1 dimension position sensitivity, or a 4 port output for 2 dimension position sensitivity). Examples of PSDs include a position-sensitive photodiode, a CMOS (Complementary Metal-Oxide Semiconductor) sensor, a CCD (Charged Coupled Device) sensor. It is understood that other types of known PSDs may be used for the apparatus. A spectrally resolved detector may comprise further metrology functions in additional to position sensitivity, for example to perform measurement of the one or more parameters of a structure 302 on the substrate.

Further embodiments are disclosed in the subsequent numbered clauses:

1. An apparatus for measuring one or more parameters of a substrate using a source radiation emitted from a radiation source and directed onto the substrate, the apparatus comprising:
    at least one reflecting element configured to receive a reflected radiation resulting from reflection of the source radiation from the substrate and further reflect the reflected radiation into a further reflected radiation; and
    at least one detector configured for measurement of the further reflected radiation for determination of at least an alignment of the source radiation and/or the substrate.
2. An apparatus according to clause 1, wherein the apparatus further comprising:
    At least one spectrally resolved detector configured to receive a diffracted radiation resulting from diffraction of the reflected radiation from the at least one reflecting element and/or from diffraction of the further reflected radiation from the at least one detector and/or from diffraction of the further reflected radiation from a further reflecting element.
3. An apparatus according to clause 1, wherein the at least one detector is an alignment detector or a spectrally resolved detector.
4. An apparatus according to clause 2 or 3, wherein the spectrally resolved detector configured for measurement of the one or more parameters of the substrate.
5. An apparatus according to any of the preceding clauses, wherein the at least one detector is an alignment detector.
6. An apparatus according to any of the preceding clauses, wherein the at least one reflecting element is at least one reflecting alignment detector.
7. An apparatus according to any of the preceding clauses, wherein the at least one reflecting element comprises a grating.
8. An apparatus according to any of the preceding clauses when referring to clause 2, wherein the spectrally resolved detector is configured to measure the further reflected radiation.
9. An apparatus according to any of the preceding clauses, wherein the at least one detector is position sensitive.
10. An apparatus according to any of the preceding clauses, wherein the at least one detector is configured to obtain a measurement for determining an alignment of the radiation to the substrate.

11. An apparatus according to any of the preceding clauses, wherein the at least one reflecting element and the at least one detector receive radiation simultaneously.
12. An apparatus according to any of the preceding clauses, wherein the at least one reflecting element and/or the at least one detector is configured to receive radiation at an oblique angle.
13. An apparatus according to clause 12, wherein the at least one reflecting element and/or the at least one detector is configured to receive radiation at grazing incidence.
14. An apparatus according to clause 12, wherein the oblique angle is set so that one of the at least one detector is configured to reflect 50% or less of received radiation.
15. An apparatus according to any of the preceding clauses, wherein the substrate comprises a structure, wherein the reflected radiation results from reflection of source radiation from the structure on the substrate.
16. An apparatus according to clause 15, wherein the structure comprises a metrology target.
17. An apparatus according to any of the preceding clauses, wherein the source radiation comprises one or more wavelengths in the range of 0.01 nm to 100 nm.
18. An apparatus according to clause 17, wherein the radiation comprises one or more wavelengths in the range of 1 nm to 100 nm.
19. An apparatus according to any of the preceding clauses, wherein the at least one detector comprises a semiconductor sensor.
20. An apparatus according to any of the preceding clauses, wherein the at least one detector is configured to determine alignment of the source radiation to the substrate with a precision of at least 1 micrometre accuracy.
21. An apparatus according to any of the preceding clauses, wherein the alignment of the source radiation and/or the substrate comprises an alignment of the radiation to a height component of the substrate.
22. A method for measuring one or more parameters of a substrate, using a source radiation emitted from a radiation source and directed onto the substrate, the method comprising:
    receiving, by at least one reflecting element configured to receive a reflected radiation resulting from reflection of the source radiation from the substrate;
    reflecting, by the at least one reflecting element configured to reflect the reflected radiation into a further reflected radiation;
    receiving, by at least one detector configured for measurement of the further reflected radiation; and
    obtaining one or more measurements for determining an alignment of the source radiation and/or the substrate.
23. A lithographic apparatus comprising an apparatus according to any of clauses 1-21.
24. A metrology apparatus comprising an apparatus according to any of clauses 1-21.
25. An inspection apparatus comprising an apparatus according to any of clauses 1-21.
26. A lithographic cell comprising an apparatus according to any of clauses 1-21.

Further embodiments are also disclosed in the subsequent numbered clauses:
1. An apparatus for measuring one or more parameters of a substrate using source radiation emitted from a radiation source and directed onto the substrate, the apparatus comprising:
   at least one alignment detector configured to receive reflected radiation resulting from reflection of the source radiation from the substrate; and
   a spectrally resolved detector configured to receive diffracted radiation resulting from diffraction of the reflected radiation from the at least one alignment detector and/or radiation resulting from diffraction of the source radiation from the substrate;
   wherein the spectrally resolved detector is configured for measurement of the one or more parameters of the substrate,
   and wherein the at least one alignment detector is configured for determination of an alignment of the source radiation and/or the substrate.
2. An apparatus according to clause 1, wherein the spectrally resolved detector is configured to measure radiation that has been diffracted after it has been reflected by the at least one alignment detector.
3. An apparatus according to any of the preceding clauses, wherein the reflected radiation is specular reflected radiation.
4. An apparatus according to any of the preceding clauses, wherein the at least one alignment detector and/or the spectrally resolved detector is position sensitive.
5. An apparatus according to any of the preceding clauses, wherein the at least one alignment detector is configured to obtain a measurement for determining an alignment of the radiation to the substrate.
6. An apparatus according to any of the preceding clauses, wherein the at least one alignment detector comprises first and second alignment detectors, wherein both of the first alignment detector and the second alignment detector receive radiation simultaneously.
7. An apparatus according to clause 6, wherein the reflected radiation comprises first reflected radiation resulting from reflection of the source radiation from the substrate, and second reflected radiation resulting from reflection of the first reflected radiation from the first alignment detector, and wherein the first alignment detector is configured to receive the first reflected radiation, and the second alignment detector is configured to receive the second reflected radiation.
8. An apparatus according to any of clauses 6-7, wherein the second alignment detector forms at least part of the spectrally resolved detector.
9. An apparatus according to any of the preceding clauses, further comprising a grating configured to receive at least part of the reflected radiation and to produce the diffracted radiation.
10. An apparatus according to clause 9, wherein the grating forms part of the at least one alignment detector.
11. An apparatus according to clause 10, when dependent directly or indirectly on clause 6, wherein the grating forms part of the first and/or second alignment detector.
12. An apparatus according to any of the preceding clauses, wherein the at least one alignment detector is configured to receive radiation at an oblique angle.
13. An apparatus according to clause 12, wherein the at least one alignment detector is configured to receive radiation at grazing incidence.

14. An apparatus according to clause 12, wherein the at least angle between the substrate and the at least one alignment detector is set so that one of the at least one alignment detector is configured to reflect 50% or less of received radiation.
15. An apparatus according to any of the preceding clauses, wherein the substrate comprises a structure, wherein the reflected radiation results from reflection of source radiation from the structure on the substrate.
16. An apparatus according to clause 15, wherein the structure comprises a metrology target.
17. An apparatus according to any of the preceding clauses, wherein the source radiation comprises one or more wavelengths in the range of 0.01 nm to 100 nm.
18. An apparatus according to clause 17, wherein the radiation comprises one or more wavelengths in the range of 1 nm to 100 nm.
19. An apparatus according to any of clauses 17 or 18, wherein the at least one alignment detector comprises a semiconductor sensor.
20. An apparatus according to any of the preceding clauses, wherein the at least one alignment detector is configured to determine alignment of the source radiation to the substrate with a precision of at least 1 micrometre accuracy.
21. An apparatus according to any of the preceding clauses, wherein the spectrally resolved detector is configured to perform a spectrally resolved measurement.
22. An apparatus according to any of the preceding clauses, wherein the alignment of the source radiation and/or the substrate comprises an alignment of the radiation to a height component of the substrate.
23. An apparatus according to any of the preceding clauses, wherein the diffracted radiation is non-zeroth order diffracted radiation.
24. A method for measuring one or more parameters of a substrate, using source radiation emitted from a radiation source and directed onto the substrate, the method comprising:
  receiving, by at least one alignment detector, reflected radiation resulting from reflection of the source radiation from the substrate;
  receiving, by a spectrally resolved detector, diffracted radiation resulting from diffraction of the reflected radiation from the at least one alignment detector;
  measuring, by the spectrally resolved detector, the one or more parameters of the substrate; and obtaining one or more measurements, by the at least one alignment detector, for determining an alignment of the source radiation and/or the substrate.
25. A lithographic apparatus comprising an apparatus according to any of clauses 1-23.
26. A metrology apparatus comprising an apparatus according to any of clauses 1-23.
27. An inspection apparatus comprising an apparatus according to any of clauses 1-23.
28. A lithographic cell comprising an apparatus according to any of clauses 1-23.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays. As an alternative to optical metrology methods, it has also been considered to use X-rays, optionally hard X-rays, for example radiation in a wavelength range between 0.01 nm and 10 nm, or optionally between 0.01 nm and 0.2 nm, or optionally between 0.1 nm and 0.2 nm, for metrology measurements.

The invention claimed is:

1. An apparatus comprising:
a reflecting element configured to receive a reflected radiation resulting from reflection of source radiation from a substrate and to further reflect the reflected radiation into a further reflected radiation;
a first detector configured to perform a first alignment measurement of the further reflected radiation;
a diffraction element configured to diffract the reflected radiation or the further reflected radiation into a diffracted radiation; and
a second detector configured to perform a measurement of the diffracted radiation to determine one or more parameters of a structure on the substrate,
wherein an alignment between the source radiation and the substrate and one or more parameters of the substrate are measured substantially simultaneously,
wherein the reflecting element or the second detector is further configured to perform a second alignment measurement, and
wherein the first alignment measurement and the second alignment measurement are configured to determine a position of the substrate within the apparatus and to determine an alignment between a lithographically patterned or exposed structure on the substrate and the source radiation in at least a first degree of freedom and a second degree of freedom.

2. The apparatus of claim 1, wherein the second detector is a spectrally resolved detector configured to receive diffracted radiation resulting from diffraction of the reflected radiation from the reflecting element and/or from diffraction of the further reflected radiation from the first detector and/or from diffraction of further reflected radiation from a further reflecting element.

3. The apparatus of claim 1, wherein the first and/or second detector is a position detector or a spectrally resolved detector.

4. The apparatus of claim 1, wherein the reflecting element is a reflecting alignment detector.

5. The apparatus of claim 1, wherein the reflecting element comprises a grating.

6. The apparatus of claim 1, wherein at least one of the first or second detectors is position sensitive.

7. The apparatus of claim 1, wherein the reflecting element and the first detector and/or the second detector receives radiation substantially simultaneously.

8. The apparatus of claim 1, wherein the reflecting element, the first detector and/or the second detector is configured to receive radiation at an oblique angle, the oblique angle being set so that at least one of the first or second detectors is configured to reflect 50% or less of the received radiation.

9. The apparatus according to claim 1, wherein the reflecting element and/or at least one of the first or second detectors is configured to receive radiation at grazing incidence.

10. The apparatus of claim 1, wherein:
the reflected radiation results from the reflection of the source radiation from the structure on the substrate.

11. The apparatus of claim 1, wherein the source radiation comprises one or more wavelengths in the range of 0.01 nm to 100 nm.

12. The apparatus of claim 1, wherein at least one of the alignment of the first degree of freedom or the alignment of the second degree of freedom measures a height dimension of the substrate.

13. The apparatus of claim 1, wherein the reflecting element is a reflecting detector and the diffraction element is coupled to a surface of the reflecting element or the first detector.

14. A method comprising:
receiving, by a reflecting detector, a reflected radiation resulting from a reflection of source radiation from a lithographically patterned or exposed structure on a substrate, the reflecting detector comprising a reflecting surface or interface coupled to a surface of a semiconductor device;
obtaining, by the reflecting detector, a first measurement for a first degree of freedom of alignment between the source radiation and the structure on the substrate;
reflecting, by the reflecting detector, the reflected radiation into a further reflected radiation;
receiving, by at least one detector, the further reflected radiation; and
obtaining, by the at least one detector, a second measurement for a second degree of freedom of alignment between the source radiation and the structure on the substrate.

15. A metrology apparatus comprising:
an apparatus configured to measure one or more parameters of a lithographically patterned or exposed structure on a substrate using a source radiation emitted from a radiation source and directed onto the structure, the apparatus comprising:
a reflecting detector comprising a reflecting surface or interface coupled to a surface of a semiconductor device and configured to receive a reflected radiation resulting from a reflection of the source radiation from the substrate, measure at least an alignment for a first degree of freedom between the source radiation and the structure, and further reflect the reflected radiation into a further reflected radiation; and
at least one detector configured for measurement of the further reflected radiation for determination of at least an alignment for a second degree of freedom between the source radiation and the structure.

* * * * *

UNITED STATES PATENT AND TRADEMARK OFFICE
CERTIFICATE OF CORRECTION

| | | |
|---|---|---|
| PATENT NO. | : 12,416,870 B2 | Page 1 of 1 |
| APPLICATION NO. | : 17/774743 | |
| DATED | : September 16, 2025 | |
| INVENTOR(S) | : Reinink et al. | |

It is certified that error appears in the above-identified patent and that said Letters Patent is hereby corrected as shown below:

In the Specification

In Column 11, Line 67, delete "10 m" and replace with -- 10 μm --.

In the Claims

In Column 29, Claim 1, Line 18, delete "from" and replace with -- from a --.

Signed and Sealed this
Twenty-eighth Day of October, 2025

John A. Squires
*Director of the United States Patent and Trademark Office*